US009923091B2

(12) United States Patent
Kudou et al.

(10) Patent No.: US 9,923,091 B2
(45) Date of Patent: Mar. 20, 2018

(54) SEMICONDUCTOR DEVICE INCLUDING POWER MOS TRANSISTOR

(71) Applicant: RENESAS ELECTRONICS CORPORATION, Tokyo (JP)

(72) Inventors: Hiroyoshi Kudou, Ibaraki (JP); Taro Moriya, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/455,410

(22) Filed: Mar. 10, 2017

(65) Prior Publication Data

US 2017/0263755 A1  Sep. 14, 2017

(30) Foreign Application Priority Data

Mar. 14, 2016  (JP) ................................. 2016-049572

(51) Int. Cl.
| | | |
|---|---|---|
| *H01L 29/78* | (2006.01) | |
| *H01L 29/06* | (2006.01) | |
| *H01L 29/66* | (2006.01) | |

(52) U.S. Cl.
CPC ...... *H01L 29/7813* (2013.01); *H01L 29/0619* (2013.01); *H01L 29/0634* (2013.01); *H01L 29/66734* (2013.01)

(58) Field of Classification Search
CPC ............. H01L 29/7813; H01L 29/0619; H01L 29/0634; H01L 29/4236; H01L 29/66704; H01L 29/7397; H01L 29/7825; H01L 29/66325; H01L 29/1095; H01L 29/7393; H01L 29/7395; H01L 29/66734
USPC ........ 257/330, 332, 520; 438/242, 270, 271, 438/361, 430
See application file for complete search history.

(56) References Cited

U.S. PATENT DOCUMENTS

| | | | |
|---|---|---|---|
| 7,485,921 B2 | 2/2009 | Kawaguchi et al. | |
| 2011/0006338 A1* | 1/2011 | Senoo | ................. H01L 21/6836 257/139 |
| 2011/0316075 A1* | 12/2011 | Hsieh | ................ H01L 29/66825 257/330 |
| 2013/0256783 A1* | 10/2013 | Katou | ................. H01L 29/7827 257/328 |

FOREIGN PATENT DOCUMENTS

| | | |
|---|---|---|
| JP | 2007-221024 A | 8/2007 |
| JP | 2009-141185 A | 6/2009 |

* cited by examiner

*Primary Examiner* — Shahed Ahmed
(74) *Attorney, Agent, or Firm* — McDermott Will & Emery LLP

(57) ABSTRACT

An n-channel power MOS transistor having a gate electrode is formed in an element formation region defined in a semiconductor substrate. A p-type guard ring region is formed in a terminal region. A plurality of p-type column regions are formed from the bottom of the p-type base region to a further deeper position. The column region located in the outermost periphery and the p$^-$-type guard ring region are spaced apart from each other by a distance. A gate electrode lead-out portion electrically coupled to the gate electrode is formed in the p$^-$-type guard ring region.

9 Claims, 13 Drawing Sheets

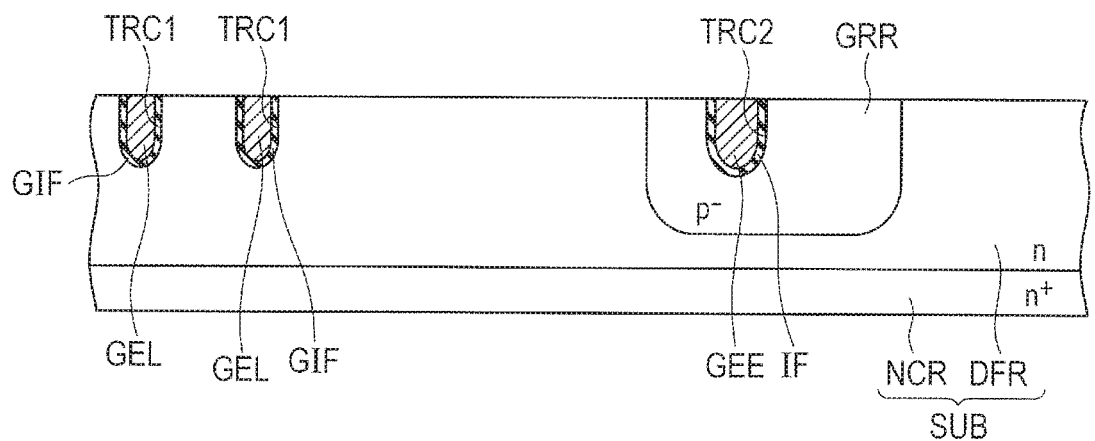
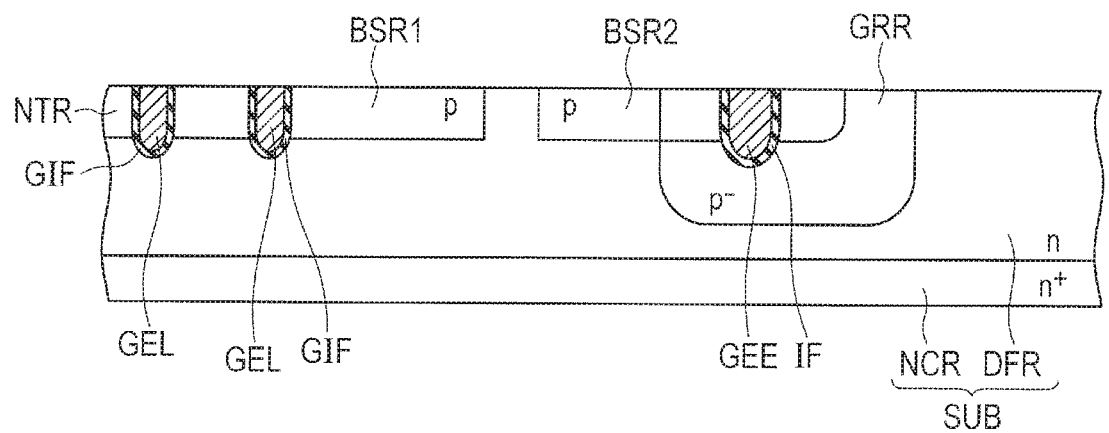

SEMICONDUCTOR DEVICE INCLUDING POWER MOS TRANSISTOR

CROSS-REFERENCE TO RELATED APPLICATIONS

The disclosure of Japanese Patent Application No. 2016-049572 filed on Mar. 14, 2016 including the specification, drawings and abstract is incorporated herein by reference in its entirety.

BACKGROUND

The present invention relates to a semiconductor device, and can be preferably used in a semiconductor device including, for example, a power MOS transistor.

Semiconductor devices including a power MOS (Metal Oxide Semiconductor) transistor, etc., are used to operate electrical components, such as lights, power steering, and power windows mounted in automobiles.

For example, an n-channel power MOS transistor is formed, as an switching element, in an element formation region defined in a semiconductor substrate of the semiconductor device. In the element formation region, a p-type base region, in which a channel is formed, is formed. A $p^-$-type guard ring region is formed in a terminal region surrounding the element formation region. A source electrode is formed on the surface side of the semiconductor substrate, and a drain electrode is formed on the rear side thereof.

An n-type drift region to serve as a drain region is formed in the semiconductor substrate. A p-type column region is formed to protrude from the bottom of the p-type base region toward the n-type drift region. The p-type column regions and the n-type drift regions are formed, for example, to be placed alternately in one direction. This structure is called a superjunction structure. Examples of patent documents in which such a semiconductor device is disclosed include Patent Documents 1 and 2.

RELATED ART DOCUMENT

Patent Document

[Patent Document 1] Japanese Unexamined Patent Application Publication No. 2009-141185

[Patent Document 2] Japanese Unexamined Patent Application Publication No. 2007-221024

SUMMARY

It is assumed that charge balance may become uneven in the region where the p-type column region and the $p^-$-type guard ring region are overlapped with each other. Accordingly, the breakdown voltage in the terminal region may decrease to a lower level than that in the element formation region.

Other problems and new characteristics will become clear from the description and accompanying drawings of the present specification.

A semiconductor device according to one embodiment includes: a semiconductor substrate in which an element formation region is defined; a base region; a gate electrode; a source region; a plurality of column regions; a guard ring region; and a gate lead-out electrode. The semiconductor substrate will serve as a drain region. The base region is formed from the surface of the semiconductor substrate to a first depth. The gate electrode is formed in the base region, and is formed in a first trench, which extends from the surface of the base region to a second depth deeper than the first depth, with a first insulating film interposed therebetween. The source region is formed from the surface of the base region to a third depth shallower than the first depth. The column regions are formed from the bottom of the base region to a fourth depth deeper than the first depth, and are placed spaced apart from each other. The guard ring region is formed from the surface of the semiconductor substrate to a fifth depth deeper than the first depth so as to surround the outer periphery of the base region from both the lower side of the outer periphery and the further outer side than the outer periphery. The gate lead-out electrode is formed in a second trench, which extends from the surface of the region where the base region and the guard ring region are overlapped with each other to a sixth depth shallower than the fifth depth, with a second insulating film interposed therebetween, and is electrically coupled to the gate electrode. The column region placed in the outermost periphery of the column regions and the guard ring region are spaced apart from each other by a first distance.

A manufacturing method of a semiconductor device according to another embodiment includes the following steps. An element formation region is defined in a semiconductor substrate of a first conductivity type that will serve as a drain region. By introducing impurities of a second conductivity type so as to surround a region of the semiconductor substrate located in the element formation region, a guard ring region is formed from the surface of the semiconductor substrate to a first depth. By processing the region of the semiconductor substrate and the guard ring region that are located in the element formation region, a first trench, which reaches a second depth deeper than the first trench, is formed in the region of the semiconductor substrate, and a second trench, which reaches the second depth and is coupled to the first trench, is formed in the guard ring region. A gate electrode is formed in the first trench with a first insulating film interposed therebetween, and a gate lead-out electrode is formed in the second trench with a second insulating film interposed therebetween. By introducing impurities of the second conductivity type into the region of the semiconductor substrate located in the element formation region so as to overlap the guard ring region, a base region is formed from the surface of the region of the semiconductor substrate to a third depth shallower than the second depth. A source region is formed by introducing impurities of the first conductivity type into the base region. A plurality of column regions are formed from the bottom of the base region to a fourth depth deeper than the third depth by introducing impurities of the second conductivity type. In the step of forming the column regions, the column region located in the outermost periphery of the column regions and the guard ring region are formed to be spaced apart from each other.

In a semiconductor device according to the one embodiment, a breakdown voltage can be improved. In a manufacturing method of a semiconductor device according to the another embodiment, a semiconductor device can be obtained in which a breakdown voltage can be improved.

BRIEF DESCRIPTION OF THE DRAWINGS

FIG. 22 is a sectional view illustrating one step of a manufacturing method of a semiconductor device in the embodiment;

FIG. 23 is a sectional view illustrating a step performed after the step illustrated in FIG. 22 in the embodiment;

DETAILED DESCRIPTION

First Embodiment

Herein, a first example of a semiconductor device including a power MOS transistor having a superjunction structure will be described.
(Sectional Structure)

Figure 1:
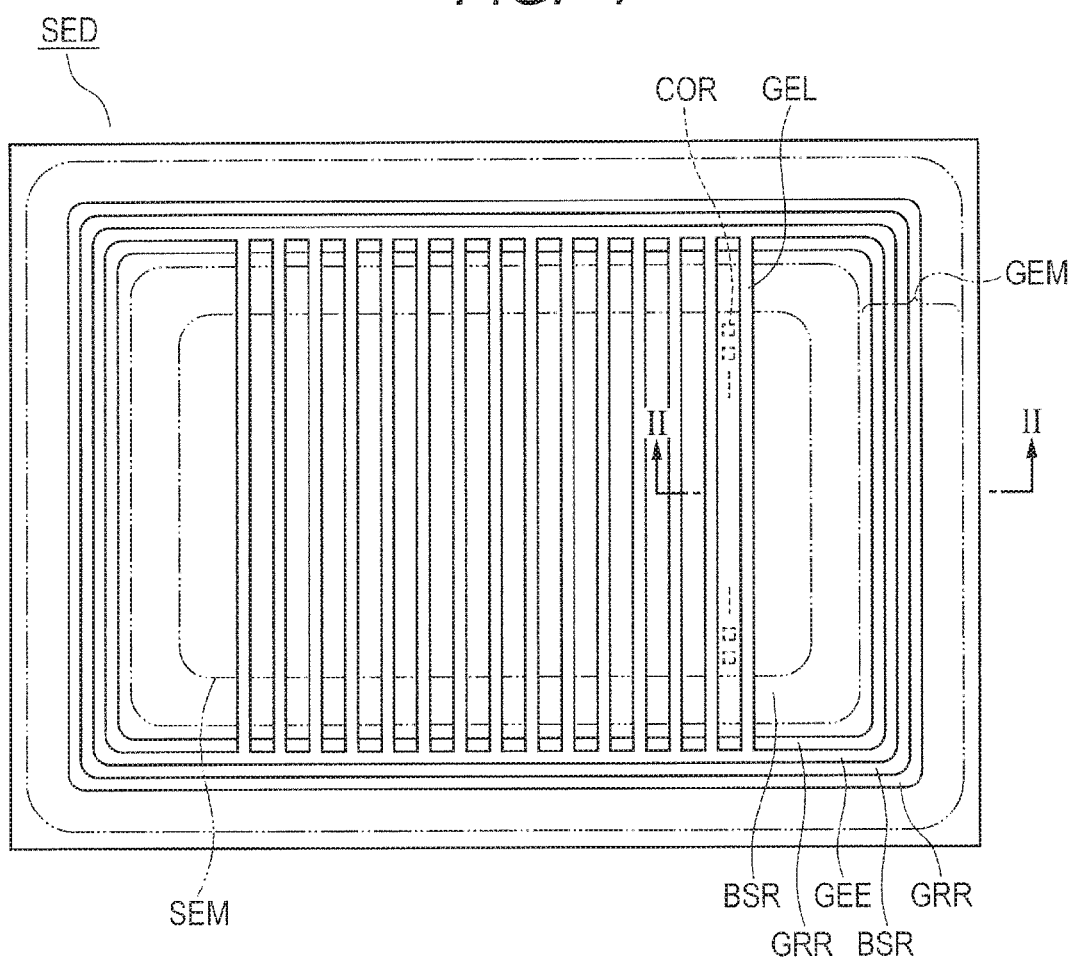
FIG. 1 is a plan view of a semiconductor device according to First Embodiment.
Figure 2:
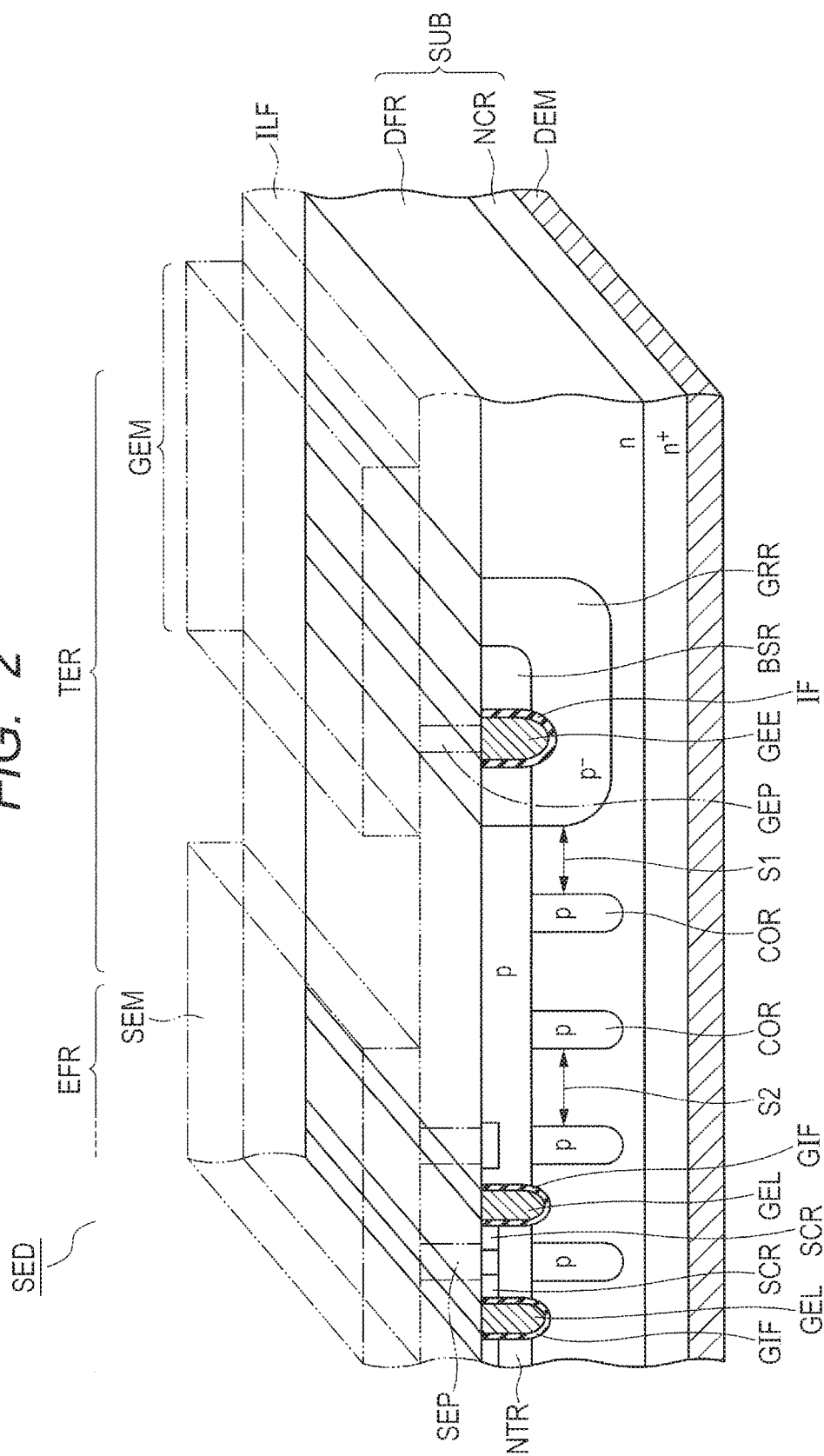
FIG. 2 is a sectional perspective view taken along Line II-II illustrated in FIG. 1 in the embodiment.

On the surface side of a semiconductor substrate SUB, an n-type drift region DFR is formed from the surface of the substrate to a predetermined depth, as illustrated in FIGS. 1 and 2. An element formation region EFR is defined in the n-type drift region DFR. An n-channel power MOS transistor NTR is formed in the element formation region EFR. A p-type base region BSR including, for example, boron is formed in the element formation region EFR. The p-type base region BSR is formed from the surface of the n-type drift region DFR (semiconductor substrate SUB) to a predetermined depth. A p$^-$-type guard ring region GRR including, for example, boron is formed in a terminal region TER (outer periphery of the p-type base region BSR) that surrounds the element formation region EFR.

A trench TRC1 (see FIG. 10) that penetrates the p-type base region BSR to reach the n-type drift region DFR is formed. A gate electrode GEL is formed in the trench TRC1 with a gate insulating film GIF interposed therebetween. An n-type source region SCR including, for example, arsenic is formed in the p-type base region BSR as the source region of the power MOS transistor NTR. The source region SCR is formed from the surface of the p-type base region BSR to a predetermined depth. A p$^+$-type region is formed on the side of the source region SCR.

A plurality of p-type column regions COR each including, for example, boron are formed from the bottom of the p-type base region BSR to a predetermined depth. Herein, the p-type column region COR is formed to have an almost rectangular planar pattern as one example. The p-type column regions COR and the n-type drift region DFR are alternately placed in the element formation region (p-type base region BSR), thereby allowing the superjunction structure to be formed. The p-type column region COR located in the outermost periphery of the p-type column regions COR and the p$^-$-type guard ring GRR are spaced apart from each other by a distance S1. The adjacent p-type column regions COR are spaced apart from each other by at least a distance S2.

A trench TRC2 (see FIG. 10) is formed in the p$^-$-type guard ring region GRR. The width of the trench TRC2 is set to be larger than that of the trench TRC1 (see FIG. 10) in which the gate electrode GEL is formed. A gate electrode lead-out portion GEE is formed in the trench TRC2 with an insulating film IF interposed therebetween. The gate electrode lead-out portion GEE is electrically coupled to the gate electrode GEL.

An interlayer insulating film ILF is formed to cover the gate electrode GEL, the gate electrode lead-out portion GEE, and the like. The interlayer insulating film ILF is formed, for example, by a BPSG (Boro Phospho Silicate Glass) film, or the like. A gate electrode plug GEP and a source electrode plug SEP are formed to penetrate the interlayer insulating film ILF. The gate electrode plug GEP is electrically coupled to the gate electrode lead-out portion GEE. The source electrode plug SEP is electrically coupled to the source region SCR.

A gate electrode metal film GEM and a source electrode metal film SEM are formed over the surface of the interlayer insulating film ILF. The gate electrode metal film GEM is electrically coupled to the gate electrode plug GEP. The gate electrode metal film GEM is electrically coupled to the gate electrode GEL via the gate electrode plug GEP and the gate electrode lead-out portion GEE. The source electrode metal film SEM is electrically coupled to the source electrode plug SEP. The source electrode metal film SEM is electrically coupled to the source region SCR via the source electrode plug SEP.

An n$^+$-type region NCR is formed on the rear surface side of the semiconductor substrate SUB. The n$^+$-type region NCR and the n-type drift region DFR will serve as a drain region of the power MOS transistor NTR. A drain electrode metal film DEM is formed to contact the n$^+$-type region. In the present embodiment, an n$^+$-type substrate SBB (see FIG. 7) is caused to serve as the n$^+$-type region NCR and the n-type drift region DFR is formed over the n⁺-type region NCR by epitaxial growth, and in this specification, the n⁺-type region NCR and the n-type drift region DFR are caused to serve as the semiconductor substrate SUB.
(Planar Structure)

As illustrated in FIGS. 1 and 2, the p⁻-type guard ring region GRR is placed in the terminal region TER, and is formed all around the periphery of the p-type base region BSR so as to surround it. The gate electrode lead-out portion GEE is formed annularly to surround the p-type base region BSR.

A plurality of the gate electrodes GEL are placed in one direction (X direction) so as to be spaced apart from each other. Each of the gate electrodes GEL extends in a direction (Y direction) perpendicular to the one direction. The gate electrodes GEL are placed inside the annular gate electrode lead-out portion GEE. One end and the other end of each of the gate electrodes GEL are coupled to the annular gate electrode lead-out portion GEE so as to be electrically coupled thereto.

A plurality of the p-type column regions COR are placed spaced apart from each other, for example, in the X direction and the Y direction. For simplification of the view, FIG. 1 illustrates only part of the p-type column regions COR placed spaced apart from each other in the Y direction.

The source electrode metal film SEM is formed to cover the power MOS transistor NTR. The gate electrode metal film GEM is formed annularly to surround the source electrode metal film SEM. A semiconductor device according to First Embodiment is configured as described above.
(Operation)

Subsequently, the operations of the above semiconductor device will be described. An ON operation will be first described. In turning on the semiconductor device, a voltage higher than or equal to the threshold voltage of the power MOS transistor NTR is applied to the gate electrode GEL. For example, a voltage of approximately 12 v is herein applied to the gate electrode GEL via the gate electrode metal film GEM, the gate electrode plug GEP, and the gate electrode lead-out portion GEE. For example, a voltage of 0 V is applied to the source region SCR via the source electrode metal film SEM and the source electrode plug SEP. For example, a voltage of approximately 12 v is applied to the n*-type region NCR, etc., (drain region) via the drain electrode metal film DEM.

Figure 3:
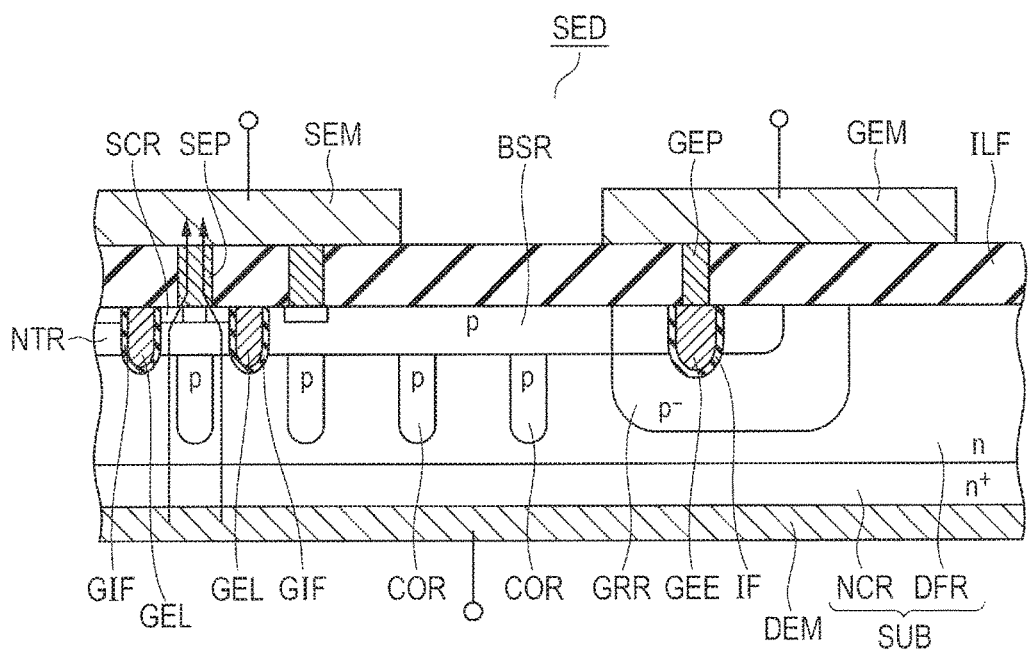
FIG. 3 is a sectional view for explaining an ON operation of a semiconductor device in the embodiment.

Thereby, an n-type channel is formed in a portion of the p-type base region BSR located with the gate insulating film GIF interposed between the base region BSR and the gate electrode GEL. A charge moves when the channel is formed, as illustrated in FIG. 3, and hence an ON state occurs in which a current flows from the drain electrode metal film DEM toward the source electrode metal film SEM, as indicated by the arrows.

Subsequently, in turning off the semiconductor device, a voltage lower than the threshold voltage of the power MOS transistor NTR is applied to the gate electrode GEL. At the time, a potential difference is generated between the source region SCR and the n-type drift region DFR. Herein, the voltages of the gate electrode GEL and the source region SCR are low.

Accordingly, a depletion layer spreads longitudinally from the pn junction portion between the n-type drift region DFR and the p-type base region BSR. Additionally, a depletion layer spreads mainly laterally also from the pn junction portion between the n-type drift region DFR and the p-type column region COR.

Thereby, the n-type drift region DFR and the p-type column region COR are filled with a depletion layer. With the formation of such a depletion layer, the movement of a charge between the source region SCR and the n-type drift region DFR is blocked. When the movement of a charge is blocked, the flow of current is blocked and an OFF state occurs.

In the element formation region where the superjunction structure is formed, a charge balance between the concentration of p-type impurities and that of n-type impurities is held, and hence a uniform depletion layer is generated. On the other hand, in the depletion layer formed in the outer periphery (terminal region TER) of the p-type base region BSR and the lower end of the gate electrode lead-out portion GEE, a place having a large curvature is generated. An electric field tends to concentrate in a place having a large curvature in a depletion layer, which may decrease the breakdown voltage of the terminal region.

In order to reduce such electric field concentration and to ensure the breakdown voltage of the terminal region rather than the element formation region, the p⁻-type guard ring region GRR is formed. The p⁻-type guard ring region GRR is formed to surround the outer periphery of the p-type base region BSR and the gate electrode lead-out portion GEE from below.

In the above semiconductor device, the p⁻-type guard ring GRR and the p-type column region COR located in the outermost periphery are spaced apart from each other by the distance S1. Thereby, a breakdown voltage can be ensured even when a voltage higher than the voltage usually used, for example, a surge voltage is applied to the semiconductor device. This will be described in comparison with a semiconductor device of a comparative example.

Comparative Example

Figure 4:
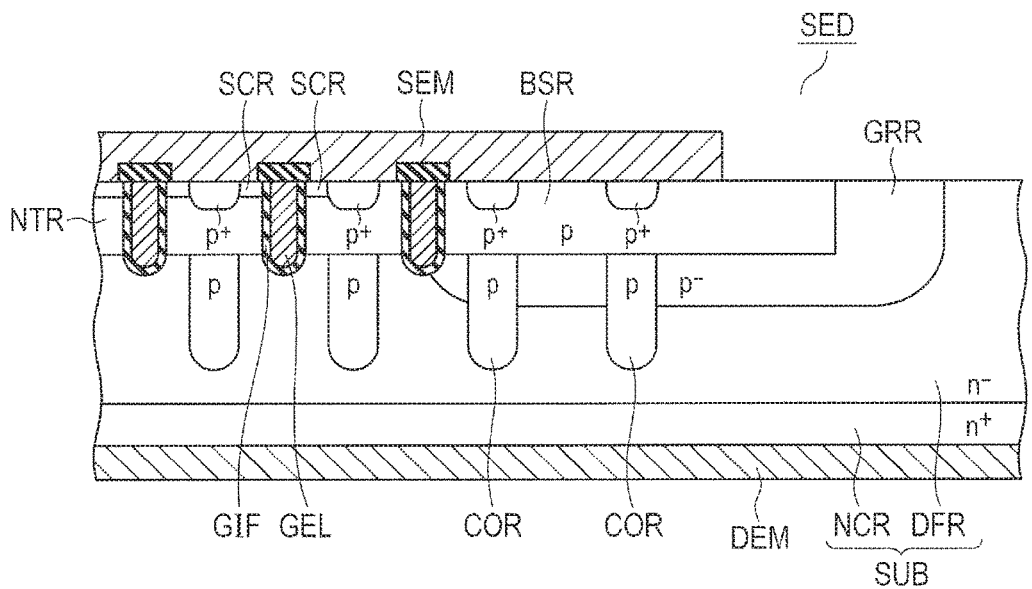
FIG. 4 is a sectional view for explaining an ON operation of a semiconductor device of a comparative example.

In a semiconductor device SED of a comparative example, the p-type column region COR located in the outer periphery of a plurality of p-type column regions COR is formed in the p⁻-type guard ring region GRR, as illustrated in FIG. 4. Since substantial configurations other than this are the same as those illustrated in FIG. 2, the same members are denoted with the same reference numeral, and description thereof will not be repeated unless necessary.

Subsequently, operations of the semiconductor device will be described. An ON operation will be first described. A voltage higher than or equal to the threshold voltage is applied to the gate electrode GEL. Thereby, an n-type channel is formed in the p-type base region BSR located with the gate insulating film GIF interposed between the base region BSR and the gate electrode GEL. When the channel is formed, an ON state occurs in which a current flows from the drain electrode metal film DEM toward the source electrode metal film SEM.

Subsequently, an OFF operation will be described. A voltage lower than the threshold voltage of the power MOS transistor NTR is applied to the gate electrode GEL. Thereby, the channel formed in the p-type base region BSR disappears. A depletion layer spreads from the pn junction portion between the n-type drift region DFR and the p-type base region BSR. Additionally, a depletion layer spreads from the pn junction portion between the n-type drift region DFR and the p-type column region COR.

Figure 5:
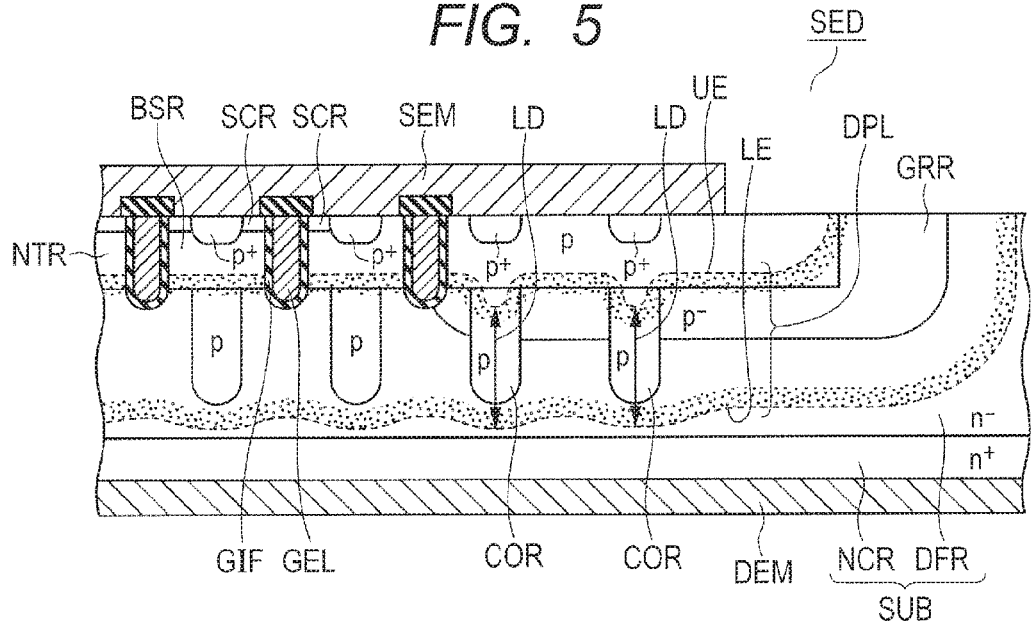
FIG. 5 is a sectional view for explaining an OFF operation and a problem of a semiconductor device of a comparative example.

Thereby, the n-type drift region DFR and the p-type column region COR are filled with a depletion layer DPL, as illustrated in FIG. 5. When the depletion layer DPL is formed, the movement of a charge between the source region SCR and the n-type drift region DFR is blocked. When the movement of a charge is blocked, the flow of current is blocked and an OFF state occurs.

In the semiconductor device SED of a comparative example, the p-type column region COR located in the outer periphery is formed in the p$^-$-type guard ring region GRR. Accordingly, the concentration of p-type impurities becomes high in the region where the p-type column region COR and the p$^-$-type guard ring region GRR are overlapped with each other, and a charge balance between impurity concentrations becomes uneven.

Accordingly, in the region where the p-type column region COR and the p$^-$-type guard ring region GRR are overlapped with each other, an upper end UE of the depletion layer DPL does not extend upward and the distance LD between the upper end UE and a lower end LE becomes smaller than those of other portions, as illustrated in FIG. 5. Accordingly, the breakdown voltage decreases in the portion where the depletion layer DPL becomes thin, and it is assumed that breakdown may be caused in the semiconductor device SED (power MOS transistor NRT). In particular, when a surge voltage, or the like, is applied, the possibility that breakdown may be caused becomes high.

In contrast to the semiconductor device SED of a comparative example, in the semiconductor device SED according to the embodiment, the p-type column regions COR are formed not to overlap the p$^-$-type guard ring region GRR, and the p-type column region COR located in the outermost periphery is formed to be spaced apart from the p$^-$-type guard ring region GRR by the distance S1, as illustrated in FIG. 2. The distance S1 is smaller than the distance S2 between the adjacent p-type column regions COR, and is set to a distance at which a thin depletion layer is not formed between the p-type column region COR and the p$^-$-type guard ring region GRR. Herein, the distance S1 can be set to a distance, for example, of approximately 1 to 2.5 µm.

Figure 6:
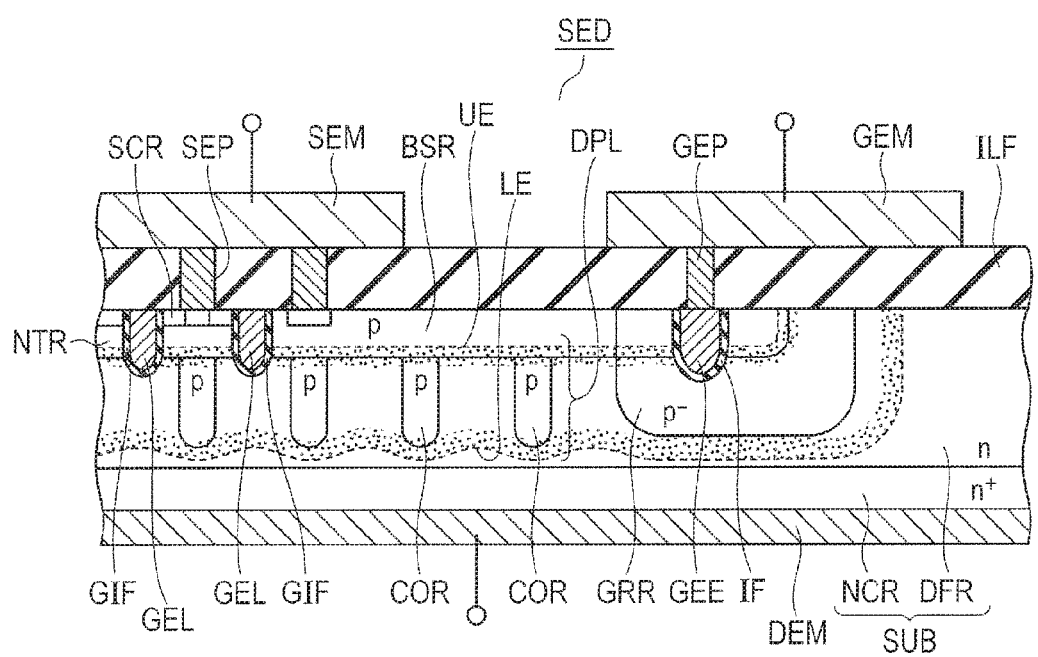
FIG. 6 is a sectional view for explaining an OFF operation and an advantage of a semiconductor device in the embodiment.

Thereby, the charge balance between the concentrations of p-type impurities can be suppressed from becoming uneven, and the depletion layer DPL is formed almost uniformly, as illustrated in FIG. 6. As a result, the breakdown voltage in the terminal region TER is ensured even when a surge voltage or the like higher than the voltage usually used is applied, and the breakdown voltage of the semiconductor device SED (power MOS transistor NRT) can be enhanced.

(Manufacturing Method)

Figure 7:
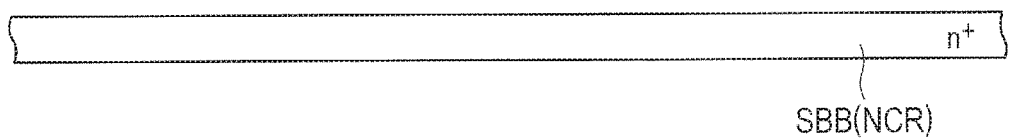
FIG. 7 is a sectional view illustrating one step of a manufacturing method of a semiconductor device in the embodiment.
Figure 8:
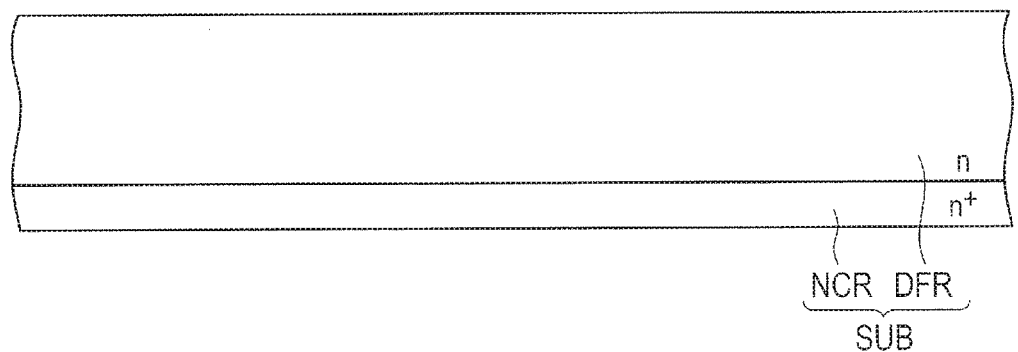
FIG. 8 is a sectional view illustrating a step performed after the step illustrated in FIG. 7 in the embodiment.

Subsequently, one example of a manufacturing method of the above semiconductor device will be described. The n$^+$-type substrate SBB is first provided, as illustrated in FIG. 7. The n$^+$-type substrate SBB will serve as the n$^+$-type region NCR. Subsequently, an n-type epitaxial layer is formed over the surface of the n$^+$-type substrate SBB by an epitaxial growth process, as illustrated in FIG. 8. The epitaxial layer will serve as the n-type drift region DFR. The semiconductor substrate SUB is formed by the n$^+$-type substrate SBB and the n-type drift region DFR (epitaxial layer).

Figure 9:
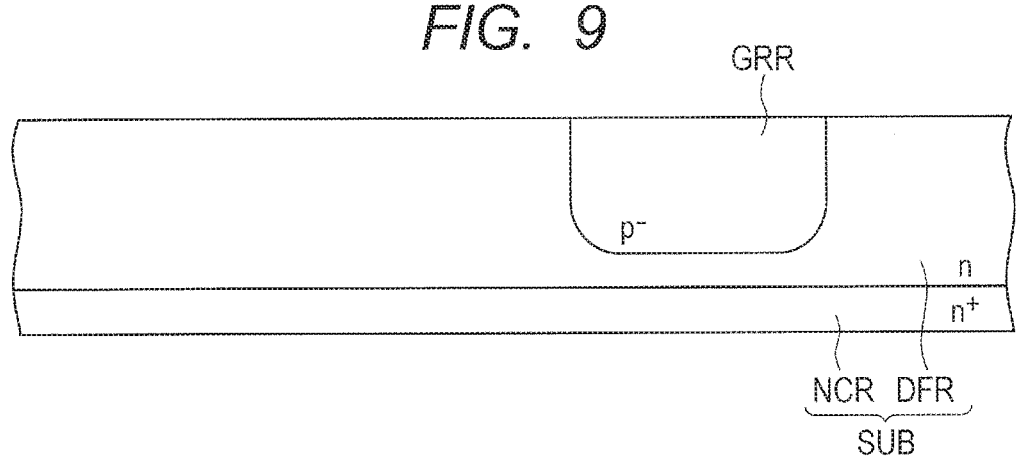
FIG. 9 is a sectional view illustrating a step performed after the step illustrated in FIG. 8 in the embodiment.

Subsequently, a resist pattern (not illustrated) for forming the p$^-$-type guard ring region is formed by performing a predetermined photoengraving process. Subsequently, p-type impurities, such as, for example, boron, are implanted by using the resist pattern as an implantation mask. Thereafter, the resist pattern is removed. Thereby, the p$^-$-type guard ring region GRR is formed from the surface of the semiconductor substrate SUB to a predetermined depth, as illustrated in FIG. 9.

Figure 10:
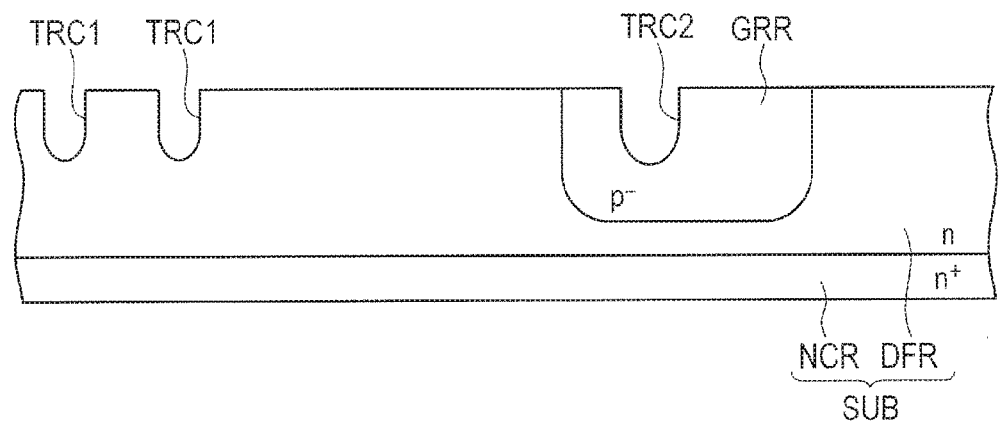
FIG. 10 is a sectional view illustrating a step performed after the step illustrated in FIG. 9 in the embodiment.

Subsequently, a resist pattern (not illustrated) for forming a trench is formed by performing a predetermined photoengraving process. Subsequently, an etching process is performed on the exposed semiconductor substrate SUB by using the resist pattern as an etching mask. Thereafter, the resist pattern is removed. Thereby, the trenches TRC1 each extending in one direction are formed in the element formation region EFR (see FIG. 2), as illustrated in FIG. 10. The annular trench TRC2 is formed in the p$^-$-type guard ring region GRR. The trench TRC1 and the trench TRC2 are formed to have the same depth. The trench TRC2 is formed to have a width larger than that of the trench TRC1.

Subsequently, a silicon oxide film (not illustrated) is formed over the side wall surfaces of the trenches TRC1 and TRC2, the surface of the semiconductor substrate SUB, and the like by performing a thermal acid treatment. Subsequently, for example, a polysilicon film (not illustrated) is formed to cover the silicon oxide film. Subsequently, a portion of the polysilicon film and that of the silicon oxide film that are located over the upper surface of the semiconductor substrate SUB are removed, while portions of the two films located in the trenches TRC1 and TRC2 are left, by performing a dry etching process.

Figure 11:
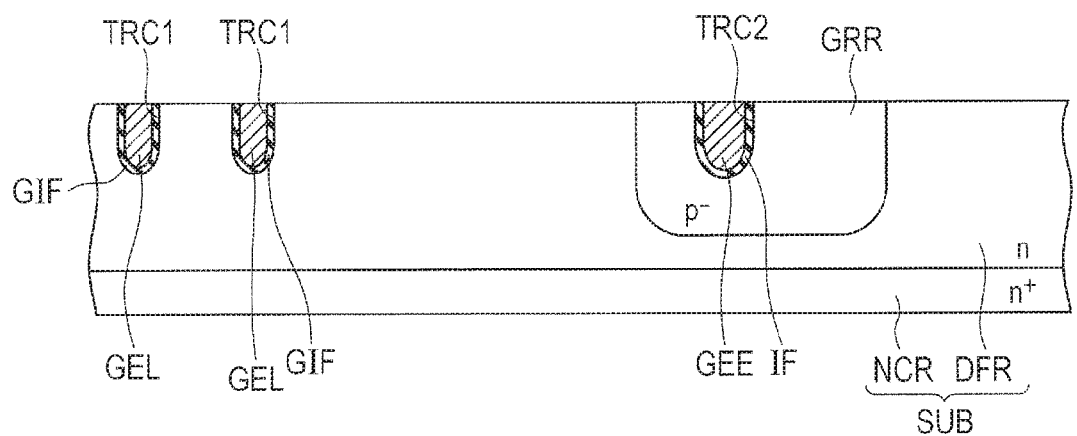
FIG. 11 is a sectional view illustrating a step performed after the step illustrated in FIG. 10 in the embodiment.

Thereby, the gate insulating film GIF is formed in the trench TRC1 with the gate electrode GEL interposed therebetween, as illustrated in FIG. 11. The gate electrode lead-out portion GEE is formed in the trench TRC2 with the insulating film IF interposed therebetween.

Subsequently, a resist pattern (not illustrated) for forming the p-type base region is formed by performing a predetermined photoengraving process. Subsequently, p-type impurities, such as, for example, boron, are implanted by using the resist pattern as an implantation mask. Thereafter, the resist pattern is removed.

Figure 12:
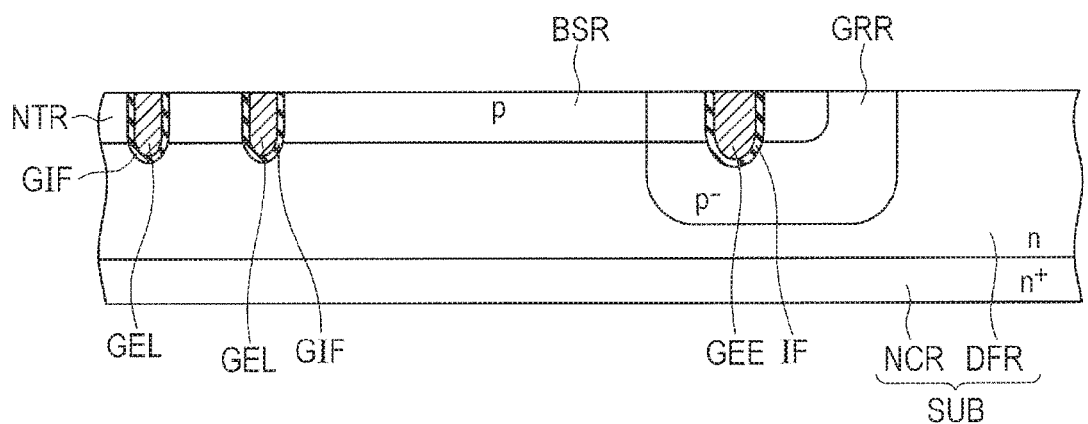
FIG. 12 is a sectional view illustrating a step performed after the step illustrated in FIG. 11 in the embodiment.

Thereby, the p-type base region BSR is formed from the surface of the semiconductor substrate SUB to a predetermined depth, as illustrated in FIG. 12. The depth of the p-type base region BSR is shallower than that of the p$^-$-type guard ring region GRR. The terminal region of the p-type base region BSR overlaps the p$^-$-type guard ring region GRR.

Subsequently, a resist pattern (not illustrated) for forming the source region is formed by performing a predetermined photoengraving process. Subsequently, n-type impurities, such as, for example, arsenic, are implanted by using the resist pattern as an implantation mask. Thereafter, the resist pattern is removed. Subsequently, a resist pattern (not illustrated) for forming the p$^+$-type region is formed.

Figure 13:
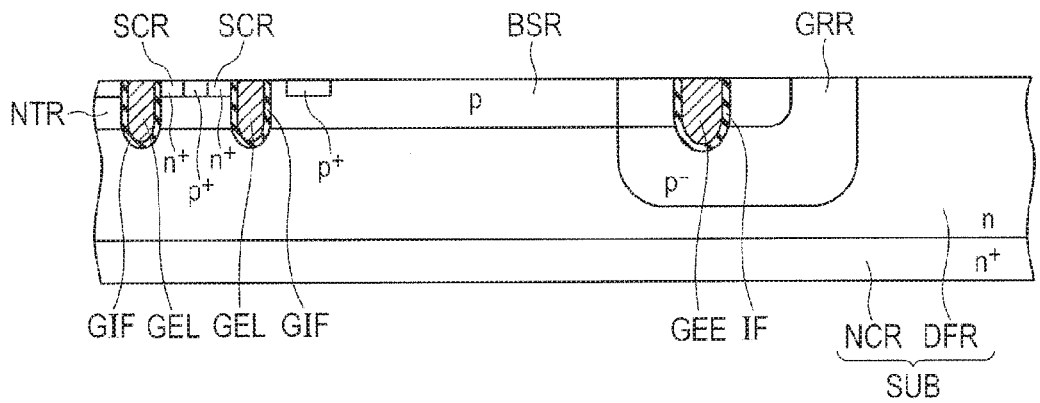
FIG. 13 is a sectional view illustrating a step performed after the step illustrated in FIG. 12 in the embodiment.

Subsequently, p-type impurities, such as, for example, boron, are implanted by using the resist pattern as an implantation mask. Thereafter, the resist pattern is removed. Thereby, the source region SCR and the p$^+$-type region are formed in the p-type base region BSR, as illustrated in FIG. 13.

Figure 14:
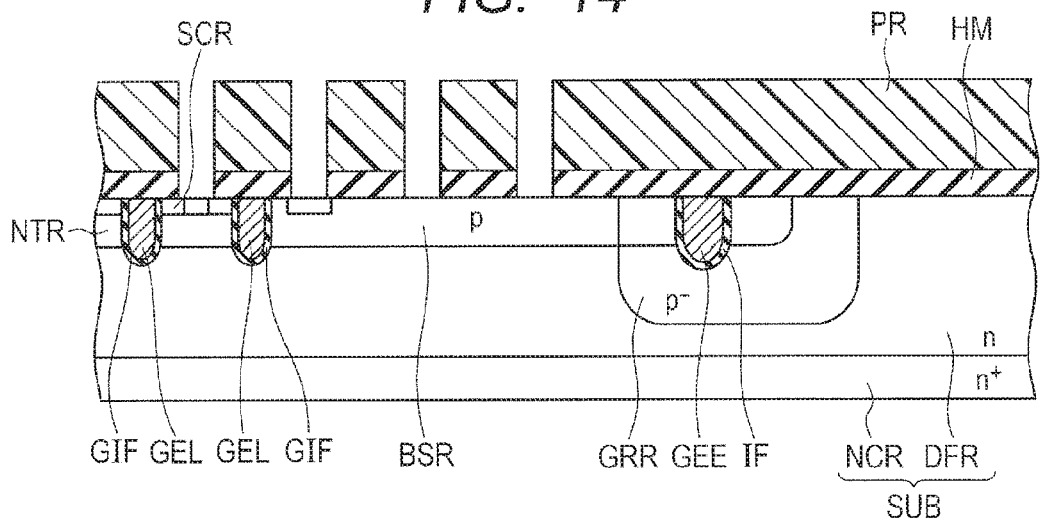
FIG. 14 is a sectional view illustrating a step performed after the step illustrated in FIG. 13 in the embodiment.

Subsequently, a silicon oxide film (not illustrated) to serve as a hard mask is formed to cover the semiconductor substrate SUB. Subsequently, a resist pattern PR for forming the p-type column region is formed by performing a predetermined photoengraving process, as illustrated in FIG. 14. Subsequently, a hard mask HM is formed by performing an etching process on the silicon oxide film with the use of the resist pattern PR as an etching mask.

Figure 15:
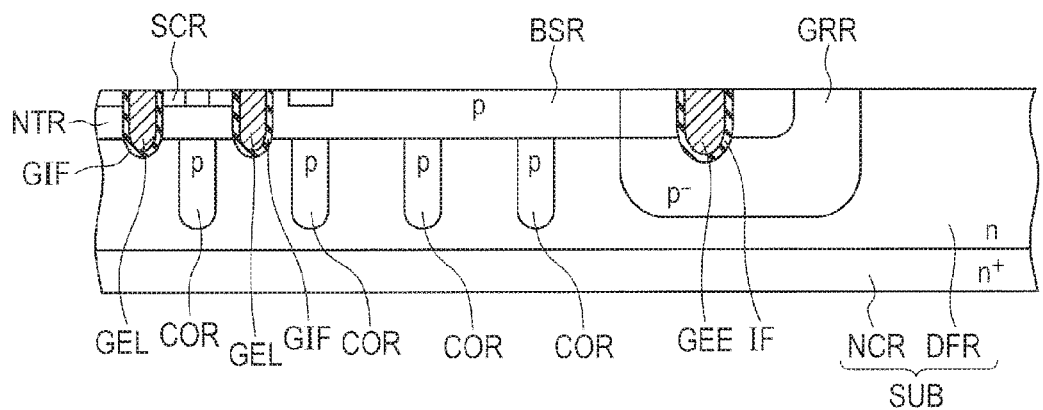
FIG. 15 is a sectional view illustrating a step performed after the step illustrated in FIG. 14 in the embodiment.

Subsequently, p-type impurities, such as, for example, boron, are implanted by using the resist pattern PR and the hard mask HM as an implantation mask. Thereafter, the resist pattern PR and the hard mask HM are removed. Thereby, the p-type column regions COR are formed, as illustrated in FIG. 15. The p-type column region COR located in the outermost periphery of the p-type column regions COR is formed to be spaced apart from the p⁻-type guard ring region GRR.

Figure 16:
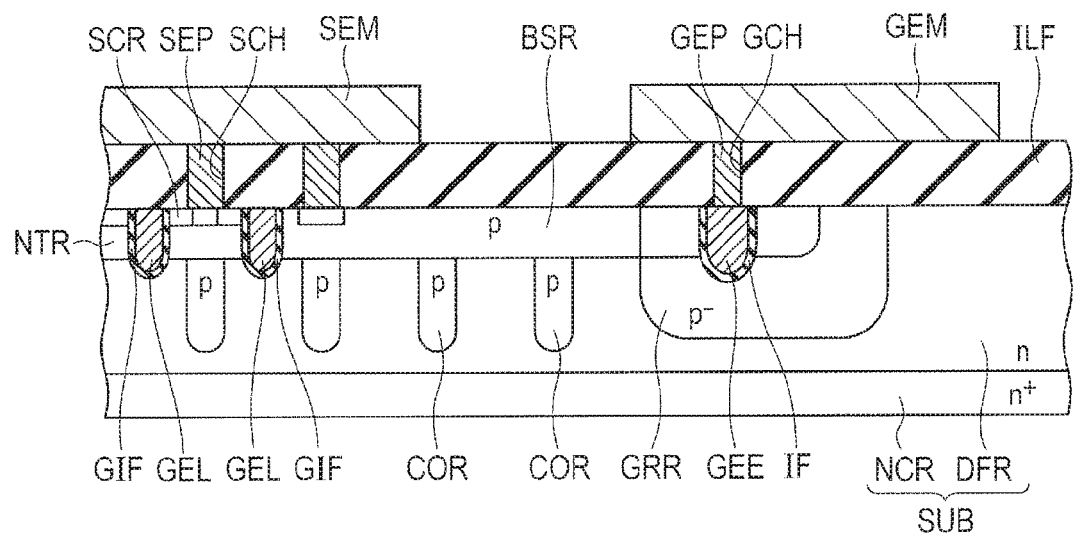
FIG. 16 is a sectional view illustrating a step performed after the step illustrated in FIG. 15 in the embodiment.

Subsequently, the interlayer insulating film ILF, such as, for example, a BPSG film, is formed to cover the semiconductor substrate SUB, as illustrated in FIG. 16. Subsequently, a source contact hole SCH and a gate contact hole GCH are formed in the interlayer insulating film ILF by performing predetermined photoengraving process and etching process. Subsequently, the source electrode plug SEP is formed in the source contact hole SCH and the gate electrode plug GEP is formed in the gate contact hole GCH by forming a tungsten film or a titanium film and by performing a predetermined etching process.

Subsequently, a conductive film (not illustrated), such as, for example, an aluminum film, is formed to cover the interlayer insulating film ILF. Subsequently, the source electrode metal film SEM and the gate electrode metal film GEM are formed by performing predetermined photoengraving process and etching process, as illustrated in FIG. 16.

Figure 17:
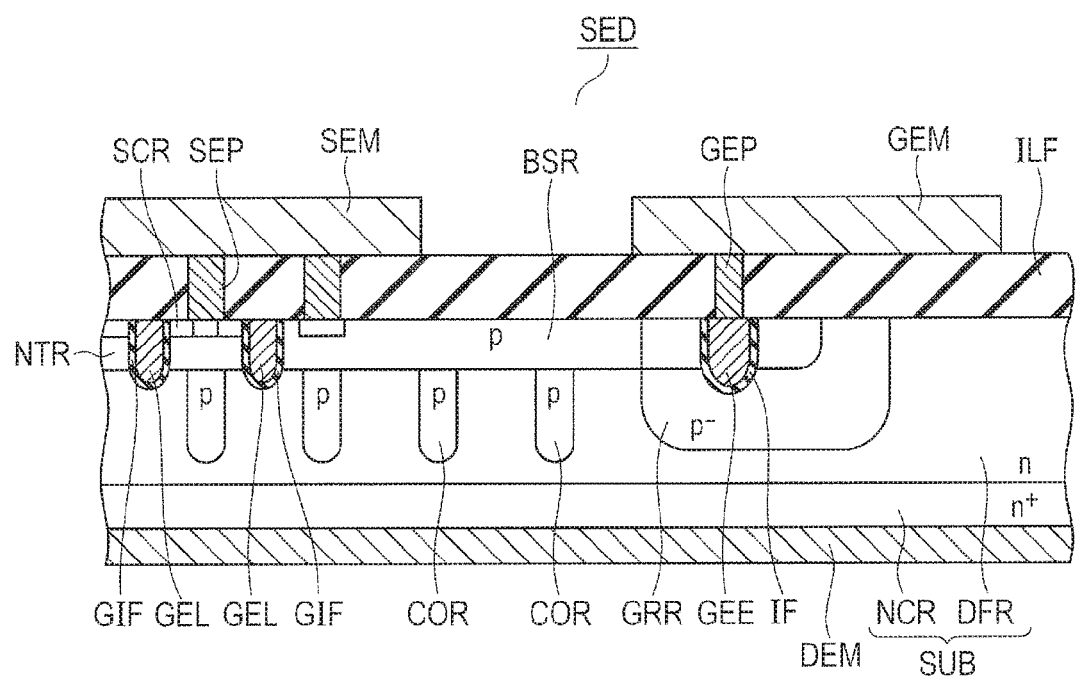
FIG. 17 is a sectional view illustrating a step performed after the step illustrated in FIG. 16 in the embodiment.

Subsequently, the drain electrode metal film DEM is formed over the rear surface of the semiconductor substrate SUB by forming, for example, an aluminum film, as illustrated in FIG. 17. Thus, the main part of the semiconductor device is completed.

In the above manufacturing method of a semiconductor device, a semiconductor device can be obtained in which the breakdown voltage of the terminal region TER is improved. Further, in the above manufacturing method, the width of the trench TRC2 is formed to be larger than that of the trench TRC1. Thereby, a margin for misalignment of the gate electrode plug GEP (gate contact hole GCH) to the gate electrode lead-out portion GEE formed in the trench TRC2 can be increased.

Furthermore, in the above manufacturing method, the withstand voltage to the gate electrode GEL formed in the trench TRC1 and that to the gate electrode lead-out portion GEE formed in the trench TRC2 can be suppressed from decreasing. For example, in a trench extending a certain length, an end exists at the point where the trench terminates in the direction of extension. At such an end, it is assumed that the withstand voltage to a gate electrode formed in the trench may decrease because the corner of the trench is rounded, etc.

In the above manufacturing method, the trench TRC2 is formed annularly, and the trench TRC1 is placed inside the annular trench TRC2 and is formed to be coupled to the trench TRC2. Accordingly, the trenches TRC1 and TRC2 are coupled together, and an end is not formed at the point where the trench terminates in the direction of extension. Thereby, a decrease in the withstand voltage, occurring due to the formation of the above end, is suppressed, and hence the withstand voltage can be ensured.

Second Embodiment

Herein, a second example of a semiconductor device including a power MOS transistor having a superjunction structure will be described.
(Sectional Structure and Planar Structure)

Figure 18:
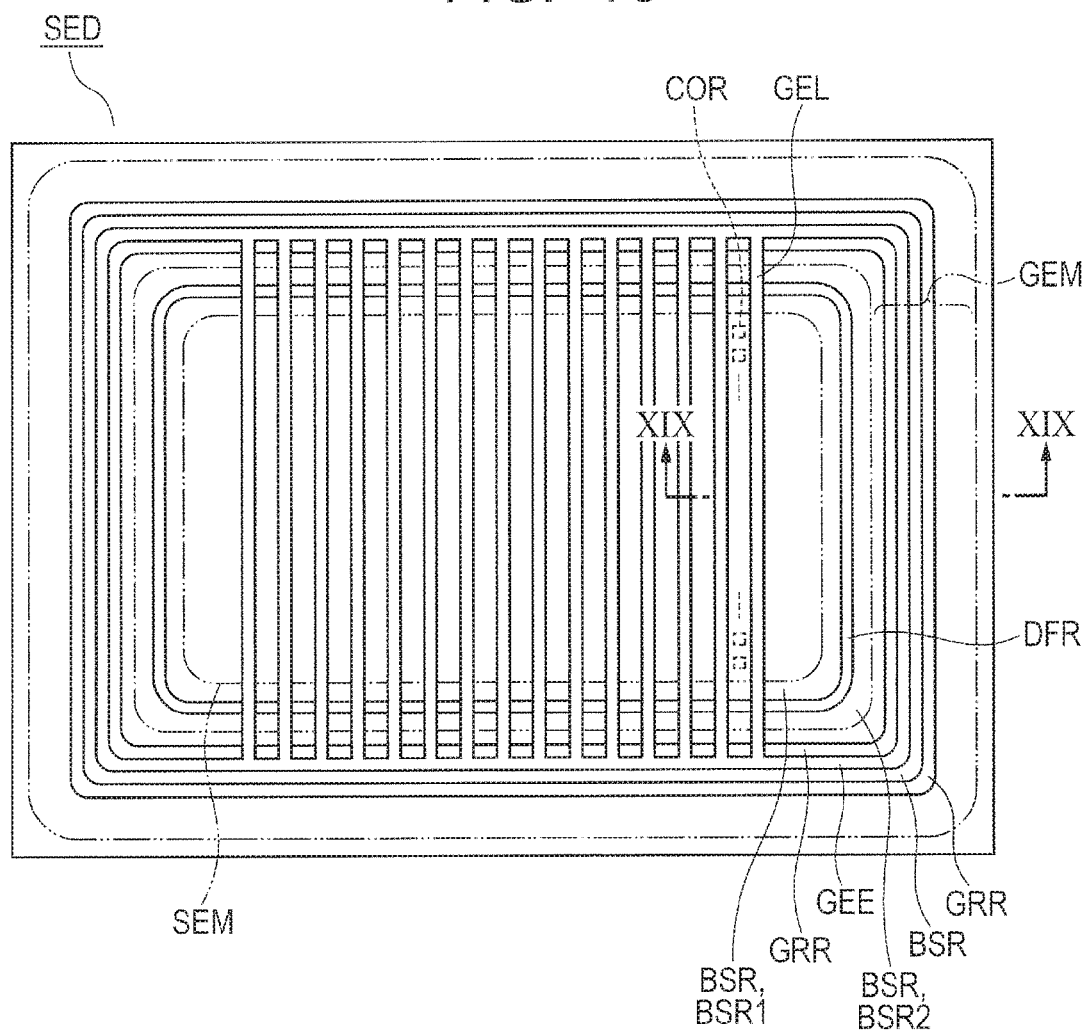
FIG. 18 is a plan view of a semiconductor device according to Second Embodiment.
Figure 19:
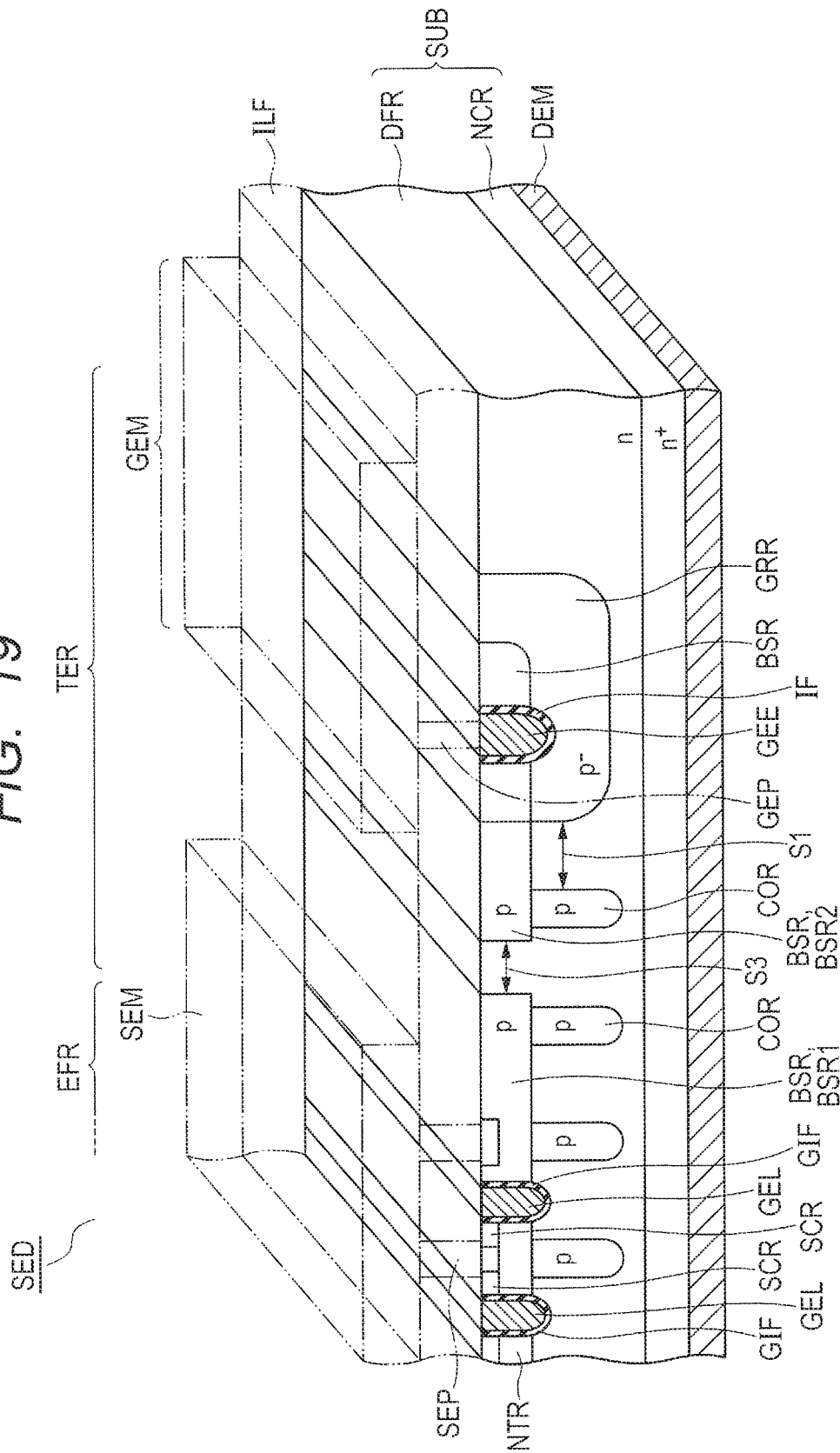
FIG. 19 is a sectional perspective view taken along Line XIX-XIX illustrated in FIG. 18, in the embodiment.

As illustrated in FIGS. 18 and 19, a p-type base region BSR is dichotomized into a p-type base region BSR1 and a p-type base region BSR2 in the semiconductor device SED. The p-type base region BSR1 and the p-type base region BSR2 are spaced apart from each other by a distance S3. The n-type drift region DFR is located between the p-type base region BSR1 and the p-type base region BSR2. The p-type base region BSR2 is placed annularly in the terminal region TER. The p-type base region BSR1 is placed inside the annular p-type base region BSR2.

The configurations other than this are the same as those of the semiconductor device illustrated in FIGS. 1 and 2, and hence the same members are denoted with the same reference numeral, and description thereof will not be repeated unless necessary.
(Operation)

Subsequently, operations of the above semiconductor device will be described. The operations are the same as those of the aforementioned semiconductor device.

Figure 20:
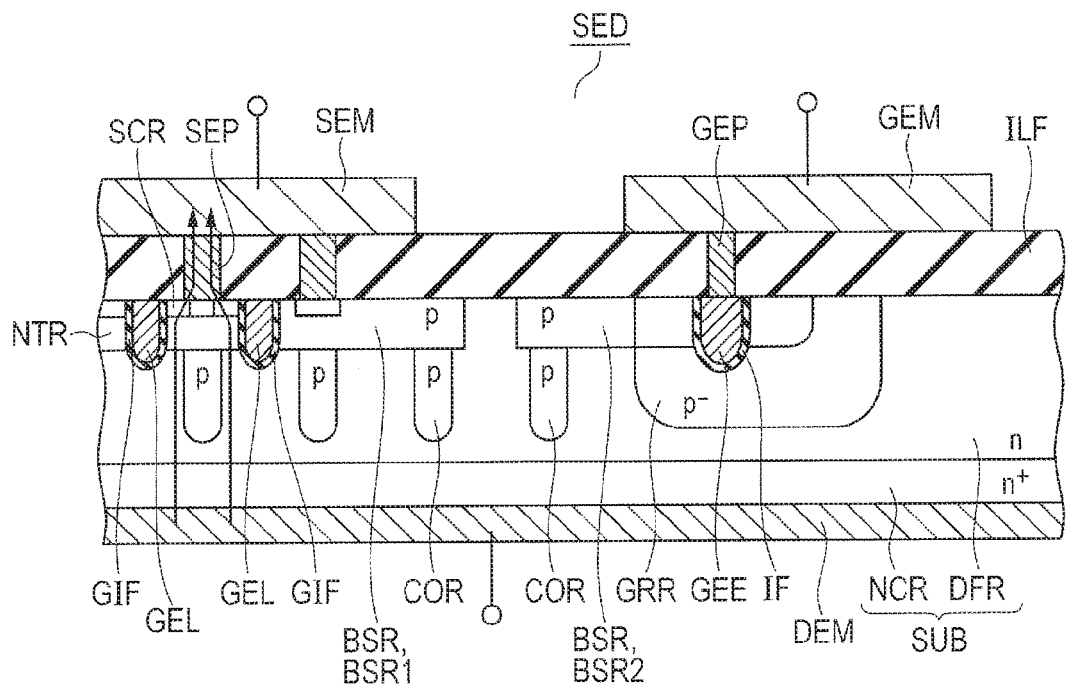
FIG. 20 is a sectional view for explaining an ON operation of a semiconductor device in the embodiment.

In turning on the semiconductor device, a voltage, for example, of approximately 12 v is first applied to the gate electrode GEL. A voltage, for example, of 0 V is applied to the source region SCR. A voltage, for example, of approximately 12 v is applied to the n⁺-type region NCR (drain region), etc. Thereby, an n-type channel is formed in the portion of the p-type base region BSR, and an ON state occurs in which as indicated by the arrows, a current flows from the drain electrode metal film DEM toward the source electrode metal film SEM, as illustrated in FIG. 20.

Subsequently, in turning off the semiconductor device, a voltage lower than the threshold voltage of the power MOS transistor NTR is applied to the gate electrode GEL.

Figure 21:
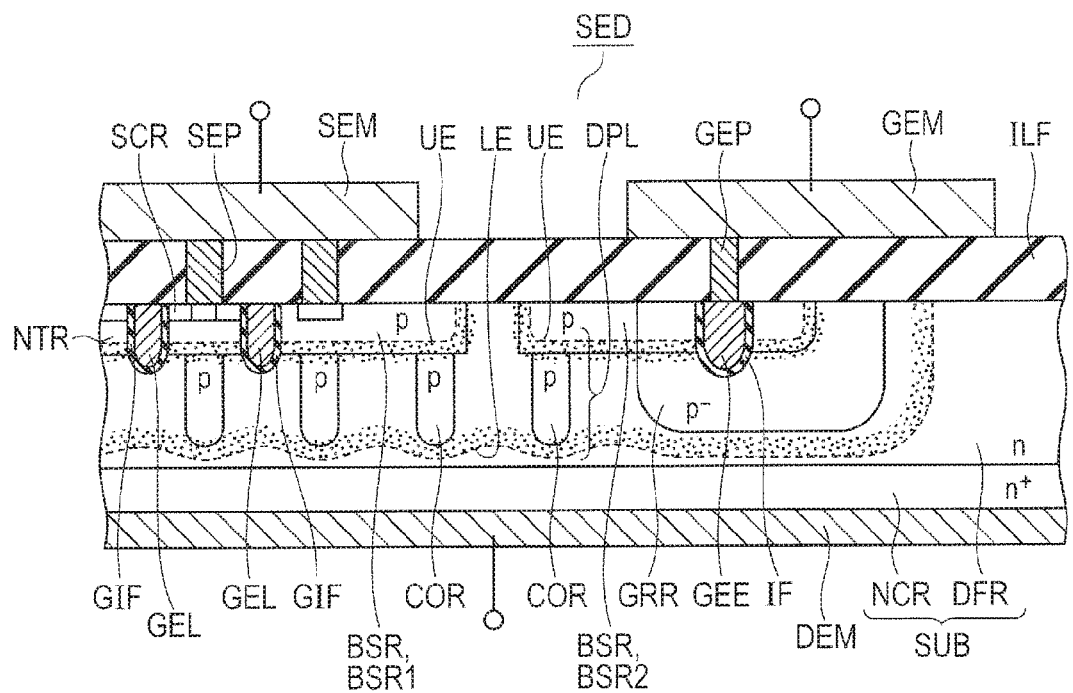
FIG. 21 is a sectional view for explaining an OFF operation and an advantage of a semiconductor device in the embodiment.

Thereby, a depletion layer spreads from the pn junction portion between the n-type drift region DFR and the p-type base region BSR, and a depletion layer spreads also from the pn junction portion between the n-type drift region DFR and the p-type column region COR. In this case, the distance S3 between the p-type base region BSR1 and the p-type base region BSR2 is set to a length at which the depletion layer stretching from the pn junction portion between the n-type drift region DFR and the p-type base region BSR1 and the depletion layer stretching from the pn junction portion between the n-type drift region DFR and the p-type base region BSR2 are coupled together. Thereby, the n-type drift region DFR and the p-type column region COR are filled with the depletion layer DPL, as illustrated in FIG. 21, and the flow of current between the source region SCR and the n-type drift region DFR is blocked and an OFF state occurs.

In the above semiconductor device, the p-type column region COR located in the outermost periphery of the p-type column regions COR is placed spaced apart from the p⁻-type guard ring region GRR. Thereby, the charge balance between the concentrations of p-type impurities is suppressed from becoming uneven, and the depletion layer DPL is formed almost uniformly, in the same way as described in First Embodiment. As a result, the breakdown voltage in the terminal region TER (outer periphery of the p-type base region BSR) is ensured even when a surge voltage or the like is applied, and the breakdown voltage of the semiconductor device SED (power MOS transistor NRT) can be improved.

Further, in the above semiconductor device, the electric field in the terminal region TER can be surely reduced with the p-type base region BSR being dichotomized into the p-type base region BSR1 and the p-type base region BSR2, and hence the breakdown voltage of the terminal region TER can be further improved.

This will be described. As a result of evaluation by simulation, the present inventors have found that: when the p-type base region BSR is dichotomized into the p-type base region BSR1 and the p-type base region BSR2, the space between the equipotential lines at the end of the p-type base region BSR2 is more expanded than when it is not dichotomized; and the electric field at the end of the p-type base region BSR2 is further reduced. That is, it has been confirmed that of the p-type base region BSR1 and the p-type base region BSR2 obtained by the dichotomization, the p-type base region BSR2 located outside and the p⁻-type guard ring region GRR function as field limiting regions.
(Manufacturing Method)

Subsequently, one example of a manufacturing method of the above semiconductor device will be described. As illustrated in FIG. 22, the gate electrode GEL and the gate electrode lead-out portion GEE are first formed after the steps similar to those illustrated in FIGS. 7 to 11 are performed.

Subsequently, a resist pattern (not illustrated) for forming the p-type base region is formed by performing a predetermined photoengraving process. Subsequently, p-type impurities are implanted by using the resist pattern as an implantation mask. Thereafter, the resist pattern is removed.

Thereby, the p-type base region BSR1 and the p-type base region BSR2 are formed, as illustrated in FIG. 23. A portion of the n-type drift region DFR, into which p-type impurities have not been implanted, is located in the region between the p-type base region BSR1 and the p-type base region BSR2. The portion of the n-type drift region DFR is annularly located inside the p⁻-type guard ring region GRR.

Figure 24:
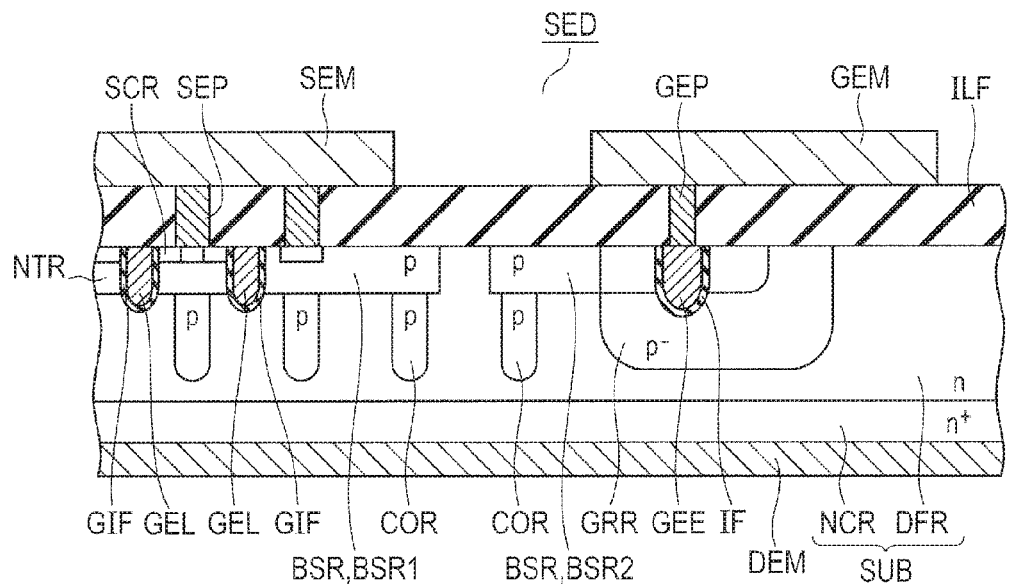
FIG. 24 is a sectional view illustrating a step performed after the step illustrated in FIG. 23 in the embodiment.

Thereafter, the main part of the semiconductor device SED is completed after the steps similar to those illustrated in FIGS. 13 to 17 are performed, as illustrated in FIG. 24.

In the above semiconductor device, a semiconductor device can be manufactured in which the breakdown voltage of the terminal region TER can be further improved, only by changing the pattern of a mask for forming the p-type base region BSR, without adding a manufacturing step.

Further, the width of the trench TRC2 is formed to be larger than that of the trench TRC1 in the same way as described in First Embodiment. Thereby, a margin for misalignment of the gate electrode plug GEP (gate contact hole GCH) to the gate electrode lead-out portion GEE formed in the trench TRC2 can be increased.

Furthermore, the withstand voltage to the gate electrode GEL formed in the trench TRC1 and that to the gate electrode lead-out portion GEE formed in the trench TRC2 can be ensured in the same way as described in First Embodiment.
(Variation)

Figure 25:
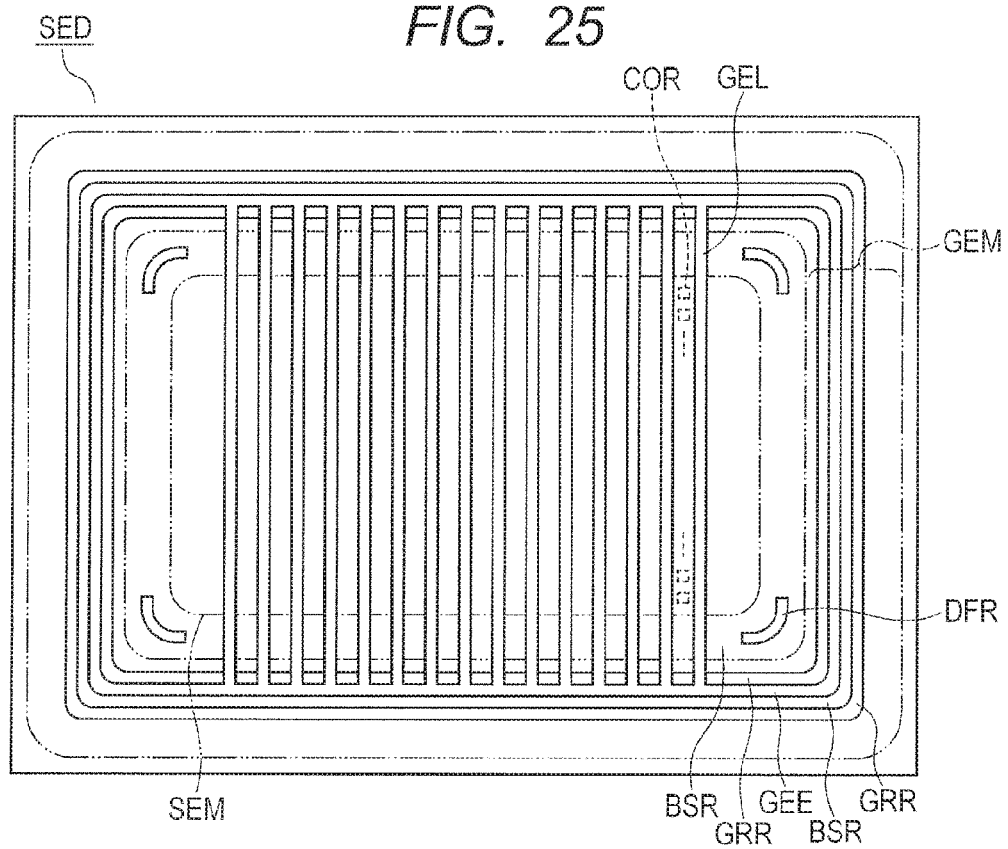
FIG. 25 is a plan view of a semiconductor device according to a variation in the embodiment.

In the above semiconductor device, the case, in which the annular n-type drift region DFR is located so as to dichotomize the p-type base region BSR into the p-type base region BSR1 and the p-type base region BSR2, has been described as an example. In order to reduce the electric field in the terminal region TER, the portion of the n-type drift region DFR may be placed only in a corner where an electric field tends to concentrate, as illustrated, for example, in FIG. 25.

In the semiconductor device SED according to the above each embodiment, the p-type column region COR having a rectangular planar pattern has been taken as an example. The planar pattern of the p-type column region should not be limited to a rectangular one, and may be, for example, a striped one, and the planar pattern thereof has only to be a shape in which a variation does not occur in the width of the depletion layer during an OFF state. Additionally, the above description has been made by taking an n-channel power MOS transistor as an example of the power MOS transistor, but a p-channel power MOS transistor can also be adopted. Further, the voltage values listed in the description of operation are also one example, and the voltages should not be limited to these values.

The structure of the semiconductor device described in each embodiment can be variously combined, as necessary.

The invention made by the present inventors has been specifically described above based on preferred embodiments, but it is needless to say that the invention should not be limited to the preferred embodiments and various modifications may be made to the invention within a range not departing from the gist of the invention.

What is claimed is:

1. A semiconductor device comprising:
a region of a semiconductor substrate of a first conductivity type to serve as a drain region;
an element formation region defined in the semiconductor substrate;
a base region of a second conductivity type extending from a surface of the semiconductor substrate located in the element formation region to a first depth;
a gate electrode filling a first trench that is formed in the base region and extends from a surface of the base region to a second depth deeper than the first depth, with a first insulating film interposed between the gate electrode and the first trench;
a source region of the first conductivity type extending from the surface of the base region to a third depth shallower than the first depth;
column regions of the second conductivity type that extend from a bottom of the base region to a fourth depth deeper than the first depth and are placed spaced apart from each other;
a guard ring region of the second conductivity type extending from the surface of the semiconductor substrate to a fifth depth deeper than the first depth so as to surround an outer periphery of the base region from both a lower side of the outer periphery and a further outer side than the outer periphery; and
a gate electrode lead-out portion that is formed in a second trench extending from a surface of a region where the base region and the guard ring region are overlapped with each other to a sixth depth shallower than the fifth depth, with a second insulating film interposed between the gate electrode lead-out portion and the second trench, the gate electrode lead-out portion electrically coupled to the gate electrode,
wherein a column region placed in an outermost periphery of the column regions and the guard ring region are spaced apart from each other by a first distance.

2. The semiconductor device according to claim 1, further comprising
a portion of a first conductivity type region provided in the base region of the second conductivity type.

3. The semiconductor device according to claim 2,
wherein the first conductivity type region annularly dichotomizes the base region.

4. The semiconductor device according to claim 3,
wherein a width of the annular first conductivity type region is set to a length at which in one and the other of the dichotomized base region, a first depletion layer spreading from the one of the base region and a second depletion layer spreading from the other of the base region are coupled together during an OFF state.

5. The semiconductor device according to claim 1,
wherein the column regions are spaced apart from each other by at least a second distance, and
wherein the first distance is smaller than the second distance.

6. The semiconductor device according to claim 2,
wherein the first conductivity type region is placed, in an island shape, in a corner of the base region.

7. The semiconductor device according to claim 1,
wherein a width of the second trench is larger than a width of the first trench.

8. The semiconductor device according to claim 1,
wherein the second depth of the first trench and the sixth depth of the second trench are equal to each other.

9. The semiconductor device according to claim 1,
wherein the gate electrode lead-out portion is annularly formed along the guard ring region.

\* \* \* \* \*